United States Patent [19]

Kotecha

[11] 4,399,522

[45] Aug. 16, 1983

[54] NON-VOLATILE STATIC RAM CELL WITH ENHANCED CONDUCTION INSULATORS

[75] Inventor: Harish N. Kotecha, Essex Junction, Vt.

[73] Assignee: International Business Machines Corporation, Armonk, N.Y.

[21] Appl. No.: 192,580

[22] Filed: Sep. 30, 1980

[51] Int. Cl.³ .............................................. G11C 11/40
[52] U.S. Cl. ....................................... 365/185; 357/23
[58] Field of Search ...................... 365/154, 184, 185; 357/23 VT

[56] References Cited

U.S. PATENT DOCUMENTS

| | | | |
|---|---|---|---|
| 3,676,717 | 7/1972 | Lockwood | 307/304 |
| 3,728,695 | 4/1973 | Bentchkowsky | 365/185 |
| 4,095,281 | 6/1978 | Denes | 365/156 |
| 4,103,348 | 7/1978 | Fagan | 365/228 |
| 4,122,541 | 10/1978 | Uchida | 365/154 |
| 4,128,773 | 12/1978 | Troutman et al. | 307/238 |
| 4,175,290 | 11/1979 | Harari | 365/156 |
| 4,207,615 | 6/1980 | Mar | 365/95 |
| 4,217,601 | 8/1980 | Dekeersmaecker et al. | 357/23 VT |

OTHER PUBLICATIONS

"High Current Injection into SiO₂ from Si Rich SiO₂ Films and Experimental Applications" by D. J. DiMaria et al., J. Appl. Pys. 51(5), May 1980, pp. 2722-2735.

"Electrically-Alterable Memory Using a Dual Electron Injector Structure" by D. J. DiMaria et al., IEEE Electron Device Letters, vol. EDL-1, No. 9, Sep. 1980, pp. 179-181.

Primary Examiner—Terrell W. Fears
Attorney, Agent, or Firm—Stephen J. Limanek

[57] ABSTRACT

This invention provides improved non-volatile semiconductor memories which include a volatile latch circuit having a data node and first and second cross-coupled transistors, at least one of the transistors has first and second control gates, a floating gate and an enhanced conduction insulator or dual electron injector structure disposed between the first control gate and the floating gate. The second control gate is connected to the storage node. A control voltage source is connected to the first control gate for transferring charge between the enhanced conduction insulator or dual electron injector structure and the data node.

12 Claims, 2 Drawing Figures

NON-VOLATILE STATIC RAM CELL WITH ENHANCED CONDUCTION INSULATORS

TECHNICAL FIELD

This invention relates to non-volatile semiconductor memory cells and more particularly to cells which utilize a device having a floating gate and an enhanced conduction insulator.

BACKGROUND ART

A number of circuits have evolved which take advantage of the ability of field effect transistors to store charge and thus serve as memory cells. Such cells may be either dynamic or static in nature. The dynamic cells may employ only a single field effect transistor and the static cells may be arranged in a flip-flop configuration, as is well known. Each of these types of cells may be referred to as volatile cells since information stored in these cells is lost when the power supply voltage applied to the memory is lost or down. In instances where stored volatile information must be retained, an alternate power supply, such as a battery system, must be coupled to the memory for use in the event of failure of the main power supply.

Known devices for producing variable threshold voltages, such as field effect transistors having metal-nitride-oxide-silicon (MNOS) and field effect transistors which include a floating gate are capable of storing information in a non-volatile manner for long periods of time. By incorporating such non-volatile devices into memory cells, there has been provided normally operating volatile cells which do not require a backup or alternate power supply for preserving information when power interruption or failure occurs in the main power supply.

Non-Volatile memory cells which use the non-volatile MNOS devices are capable of retaining information stored volatilely in a cell but these devices require high voltage pulses for writing and erasing the information, they are slow and they require rather complex processes for their fabrication. Examples of non-volatile MNOS semiconductor memory cells are taught in U.S. Pat. Nos. 3,676,717, filed Nov. 2, 1970, 4,095,281, filed Mar. 4, 1976, 4,103,348, filed Aug. 29, 1977 and 4,122,541, filed Aug. 25, 1976.

Known non-volatile memory cells which use conventionally arranged floating gate devices are also capable of preserving information stored volatilely in a cell but these devices likewise require high voltage pulses for writing and erasing the information, they are slow and require high currents, approximately one milliampere per device, to write. Examples of known non-volatile semiconductor memory cells having incorporated therein volatile storage and using floating gates are taught in U.S. Pat. Nos. 4,128,773, filed Nov. 7, 1977 and 4,207,615, filed Nov. 17, 1978. These non-volatile floating gate devices generally operate with a tunneling mechanism which requires charge to be drawn from and directed into the semiconductor substrate through a very thin insulating layer.

In commonly assigned U.S. patent application Ser. No. 153,359, filed on May 27, 1980 by H. N. Kotecha, now U.S. Pat. No. 4,334,292, there is disclosed an electrically erasable programmable read only memory which utilizes a four port or terminal device having a floating gate with two control gates coupled to the floating gate. An enhanced conduction insulator arranged as a dual electron injector structure is disposed between the floating gate and one of the two control gates to charge and discharge the floating gate. Commonly assigned U.S. patent application Ser. No. 160,530 filed on June 18, 1980 by H. N. Kotecha and F. W. Wiedman, now U.S. Pat. No. 4,336,603, discloses a three port or terminal electrically erasable programmable read only memory which utilizes the enhanced conduction insulator. A detailed discussion of enhanced conduction insulators may be found in an article entitled "High Current Injection Into $SiO_2$ from Si rich $SiO_2$ Films and Experimental Applications" by D. J. DiMaria and D. W. Dong, Journal of Applied Physics 51(5), May 1980, pp. 2722-2735 and a basic memory cell which utilizes the dual electron injector structure is taught in an article entitled "Electrically-Alterable Memory Using A Dual Electron Injector Structure" by D. J. DiMaria, K. M. DeMeyer and D. W. Dong, IEEE Electron Device Letters, Vol. EDL-1, No. 9, September 1980, pp. 179-181.

DISCLOSURE OF THE INVENTION

It is an object of this invention to provide an improved non-volatile semiconductor memory which operates at low voltages and requires less power.

It is another object of this invention to provide an improved non-volatile semiconductor memory which can be fabricated by a simple process.

It is yet another object of this invention to provide an improved non-volatile semiconductor memory which operates faster than known non-volatile memories.

It is still another object of this invention to provide an improved non-volatile semiconductor memory which requires fewer elements and less semiconductor substrate surface than other non-volatile semiconductor memories.

In accordance with the teachings of this invention improved non-volatile semiconductor memories are provided which include a volatile latch circuit having first and second cross-coupled transistors, at least one of the transistors has first and second control gates, a floating gate and an enhanced conduction insulator or dual electron injector structure disposed between the first control gate and the floating gate. First and second load elements are coupled to the first and second transistors, respectively, forming at least one storage node, with the second control gate being connected to the storage node. A control voltage source is connected to the first control gate.

The foregoing and other objects, features and advantages of the invention will be apparent from the following and more particular description of the preferred embodiments of the invention, as illustrated in the accompanying drawing.

BEST MODE FOR CARRYING OUT THE INVENTION

Figure 1:
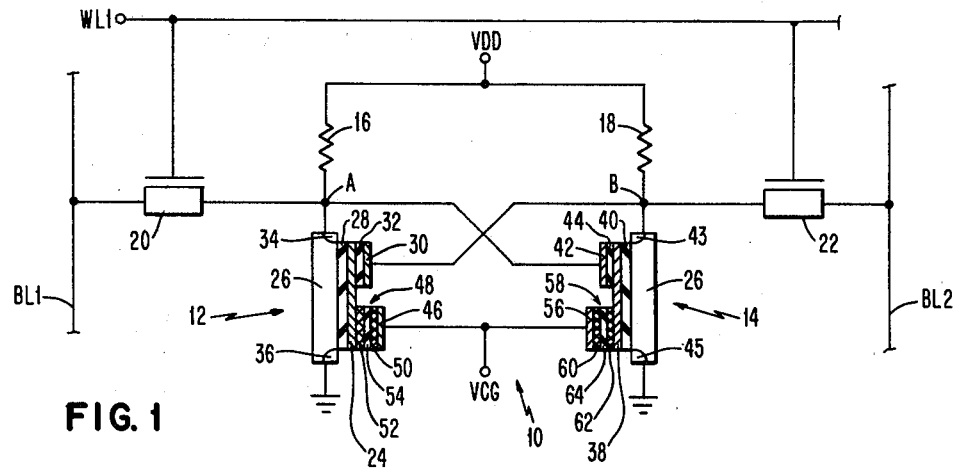
FIG. 1 is a circuit diagram of an embodiment of the non-volatile memory cell of the present invention.

Referring to FIG. 1 of the drawing in more detail, there is shown an embodiment of the non-volatile memory cell of the present invention. This cell includes a flip-flop or latch circuit 10 having first and second cross-coupled field effect transistors 12 and 14 and first and second load resistors 16 and 18 connected between a voltage source terminal VDD and the cross-coupled transistors 12, 14, with the first load resistor 16 being serially connected with the first transistor 12 and the second load resistor 18 being serially connected with the second transistor 14. A data node A is formed at the common point between the first load resistor 16 and the first transistor 12 and a data node B is formed between the second load resistor 18 and the second transistor 14. The load resistors 16 and 18 may be made, e.g., as diffusion resistors or as polysilicon resistors; field effect transistors may also be used. A first bit line BL1 is connected to data node A through a first input/output field effect transistor 20 and a second bit line BL2 is connected to storage node B through a second input/output field effect transistor 22. The first and second input/output transistors 20 and 22 each have a control gate connected to a common word line WL1.

The first cross-coupled transistor 12 includes a floating gate 24 insulated from a semiconductor substrate 26 by a layer of insulation 28. A first control gate 30, connected to node B, is insulated from the floating gate 24 by a thin dielectric layer 32 forming a capacitor with the floating gate 24 and the first control gate 30 having a high capacitance value. The floating gate 24 is disposed between first and second source/drain diffusion regions 34 and 36 in the substrate 26. The second cross-coupled transistor 14 includes a floating gate 38 insulated from the semiconductor substrate 26 by an insulating layer 40. A first control gate 42 connected to node A is separated from the floating gate 38 by a thin layer of insulation 44 forming a capacitor with the floating gate 38 and the first control gate 42 having a high capacitance value. The floating gate 38 is disposed between third and fourth source/drain diffusion regions 43 and 45 in the substrate 26.

The portion of the memory cell of FIG. 1 of the drawing described hereinabove which includes the cross-coupled transistors 12 and 14, the load resistors 16 and 18, the input/output transistors 20 and 22, the bit lines BL1 and BL2 and the word line WL1 form a volatile flip-flop or latch cell which can store binary information at data nodes A and B. If power is interrupted or turned off at terminal VDD, the information stored at data nodes A and B would be lost.

To make this cell a non-volatile memory cell there is added to the first cross-coupled transistor 12 a second control gate 46 separated from the floating gate 24 by an enhanced conduction insulator which is a dual electron injector structure 48 having a first silicon-rich layer 50, a second silicon-rich layer 52 and a conventional insulator 54 which may be a typical silicon dioxide layer. Added to the second cross-coupled transistor 14 is a second control gate 56 separated the floating gate 38 by an enhanced conduction insulator which is a dual electron injector structure 58 having a first silicon-rich layer 60, a second silicon-rich layer 62 and a normal or conventional insulating layer 64 which may be made of silicon dioxide. The second control gate 46 of the first cross-coupled transistor and the second control gate 56 of the second cross-coupled transistor 14 are connected to a pulse source terminal VCG. The dual electron injector structures 48 and 58 may be made by the method described in the above identified Journal of Applied Physics article with the silicon-rich layers each having a thickness of 100 to 250 angstroms and with each of the silicon dioxide layers 54 and 64 having a similar thickness.

Figure 2:
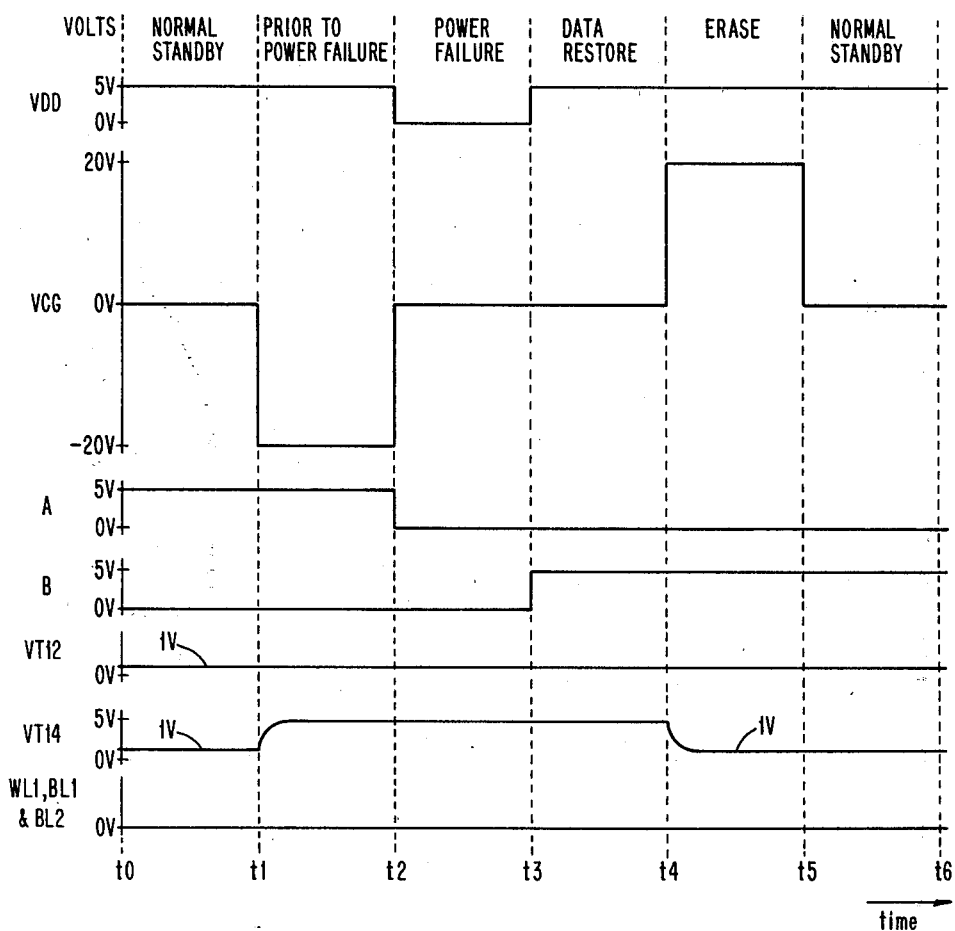
FIG. 2 is a pulse program which may be used to operate the cell of FIG. 1 of the drawing.

In order to better understand the operation of the non-volatile memory cell illustrated in FIG. 1 of the drawing reference may be had to the pulse program indicated in FIG. 2 of the drawing. During normal operation of the non-volatile memory cell illustrated in FIG. 1 of the drawing, the cell performs as a conventional volatile flip-flop storage circuit which includes the flip-flop or latch circuit 10 coupled to first and second bit lines BL1 and BL2 through the first and second input/output transistors 20 and 22. In normal operation as well as in normal standby, as indicated between times t0 and t1 of FIG. 2 of the drawing, the threshold voltage of devices 12 and 14 is approximately 1 volt. Since the voltage source or power supply connected to terminal VDD as well as the volatile cell circuit itself have a considerable amount of capacitance, the cell can be operated for a period of time, for example, about 1 or more seconds after the interruption of power, which is a sufficient length of time to transfer information stored at the data nodes A and B in the volatile latch circuit 10 to the floating gates 24 and 38.

Prior to actual power failure but at a time when power failure is anticipated, such as between times t1 and t2 as indicated in FIG. 2 of the drawing, the voltage at terminal VCG is increased negatively from 0 volts to −20 volts. Assuming that at this time transistor 12 of latch circuit 10 is turned off and that transistor 14 is on, the voltage at data node A will be approximately +5 volts and the data at node B will be at approximately 0 volts. With the voltage on the second control gate 56 of the cross-coupled transistor 14 at −20 volts and the voltage at the second control gate 42 being approximately equal to +5 volts, electrons will readily flow from the first silicon-rich layer 60 onto the floating gate 38 producing a negative charge on floating gate 38 which increases the threshold voltage of transistor 14, as indicated at VT14 between times t1 and t2 in FIG. 2 of the drawing. Since the voltage at node B and therefore at the first control gate 30 of the cross-coupled transistor 12 is at 0 volts while the voltage at the second control gate 46 is at −20 volts, electrons will not flow from the first silicon-rich layer 50 to the floating gate 24 because the voltage differential between the first and second control gates 30 and 46 is equal to only 20 volts. Accordingly, the threshold voltage of transistor 12 will not change, as indicated at VT12 in FIG. 2 of the drawing. During power failure, i.e., during times t2 to t3, the voltage at VDD, as well as the voltage at data nodes A and B, will drop to 0 volts with the only indication of the data stored at data nodes A and B being the high threshold voltage in transistor 14.

To restore the data from the floating gate 38 of the transistor 14 to data nodes A and B of the latch circuit 10, after power is restored to power supply terminal VDD, the voltage at node B will quickly increase to +5 volts between times t3 and t4 with node A being established at 0 volts since transistor 14 acts as a high impedance whereas transistor 12 acts as a low impedance. Prior to utilizing the restored data at data nodes A and B, the charge on the floating gate 38 of cross-coupled transistor 14 is erased between times t4 and t5. This is accomplished simply by applying a positive voltage of approximately 20 volts to the second control gate 56 of transistor 14. Since the voltage at the first control gate 42 of the transistor 14 is at 0 volts and negative voltage exists on the floating gate, a sufficient voltage differential, i.e., over 20 volts, is provided across the dual electron injector structure 58 to cause electrons to flow from the floating gate 38 through the injector structure 58 to the second control gate 56 to discharge floating gate 38. Thus, the threshold voltage of the cross-coupled transistor 14 returns very rapidly to 1 volt. The voltage difference between control gates 30 and 46 of transistor 12 is, on the otherhand, only 15 volts. This difference is not sufficient to make the dual electron injector structure 48 conductive and consequently the threshold voltage of transistor 12 remains unchanged. Although the restored data is the complement of the data stored in the volatile latch circuit 10 before power failure, by using simple suitable inverting circuits the data can be returned to its true form prior to utilization, or in the alternative it can be seen that the cycle just described can be repeated at the end of which the true or original data will be stored at data nodes A and B. With the voltage at terminal VCG returned to 0 volts, the volatile circuit is now returned to its standby condition, as indicated between times t5 and t6, and may be written or read at will. It is understood that other pulsing schemes are also possible to achieve the same results.

Although the voltages applied to the terminal VCG for controlling the non-volatile devices which include the second control gates 46 and 56 are indicated as having a magnitude of +20 and −20 volts, it should be understood that voltages of significantly lower values can be used but at the expense of longer switching times. For example, it has been found that the floating gate may be charged negatively to yield a 5 volt threshold voltage shift in the cross-coupled transistor with a potential difference of +25 volts between the two control gates, such as control gates 42 and 56, in about 230 microseconds, and the floating gate was erased with −15 volts between gates 42 and 56. Small voltage increases across the dual electron injector structure produce sharp drops in writing and erase times because of the exponential nature of the dual electron injector structure current-voltage characteristics. It should be noted that, if desired, one of the two dual electron injector structures 48 and 59 may be eliminated without significantly altering the operation of the cell of FIG. 1. Thus, one of the two cross-coupled transistors 12 and 14 may be a conventional field effect transistor.

It should be understood that the non-volatile memory cell illustrated in FIG. 1 of the drawing may be used in an array of a memory system in the manner disclosed in FIG. 2 of commonly assigned U.S. patent application Ser. No. 192,579, entitled "Non-Volatile RAM Cell With Enhanced Conduction Insulators" and filed by C. L. Bertin, H. N. Kotecha and F. W. Wiedman on even date. It should also be understood that such an array may have hundreds of word lines with hundreds of cells coupled to each of the word lines to provide an array containing thousands of cells.

An improved non-volatile semiconductor memory has been described hereinabove which can operate normally at the high speeds known in random access memories, yet which will not lose its data when a power failure occurs. Volatile data is retained in a non-volatile device with the use of lower voltages dissipating an insignificant amount of power than has been known heretofore and with faster data transfer times between the volatile circuitry and the non-volatile device, particularly during the erase portion of the cycle. Furthermore, the cell of the present invention uses fewer elements in each cell requiring less substrate surface, the process for making the cell is simpler than that used for making MNOS devices and the memory of the present invention uses substantially lower writing power levels than is required in floating gate devices written by hot electrons.

While the invention has been particularly shown and described with reference to preferred embodiments thereof, it will be understood by those skilled in the art that various changes in form and details may be made therein without departing from the spirit and scope of the invention.

What is claimed is:

1. A memory system comprising;
   first and second cross-coupled transistors, one of said transistors having first and second control gates, a floating gate and a dual charge injector structure disposed between the first control gate and the floating gate,
   first and second load elements coupled to said first and second transistors, respectively, forming at least one storage node,
   said second control gate being coupled to said storage node, and
   means for applying a control voltage to said first control gate.

2. A memory system comprising;
   first and second cross-coupled transistors each having a floating gate and first and second capacitors coupled to the floating gate, one of said capacitors including a dual electron injector structure,
   first and second load elements coupled to said first and second transistors, respectively, forming first and second storage nodes,
   said first storage node being coupled to said first capacitor of said first transistor and said second storage node being coupled to said first capacitor of said second transistor, and
   means for applying a control voltage to said second capacitors.

3. A memory system comprising;
   first and second cross-coupled transistors, each transistor having first and second control gates, a floating gate and a dual electron injector structure disposed between the first control gate and the floating gate of each transistor,
   first and second load elements coupled to said first and second transistors, respectively, forming first and second storage nodes,
   the second control gate of said first transistor being coupled to said second storage node and the second control gate of said second transistor being coupled to said first storage node, and
   means for applying a control voltage to said first control gates.

4. A memory system comprising;
   a volatile memory cell having a data node and first and second cross-coupled transistors, one of said transistors including:
   a first capacitor,
   a floating gate coupled to said data node through said first capacitor, and
   a second capacitor coupled to said floating gate, said second capacitor including a dual charge injector structure, and
   means coupled to said floating gate through said second capacitor for transferring charge between said floating gate and said charge injector structure.

5. A memory system as set forth in claim 4 wherein said data node has alternate first and second charge conditions and said charge transfer means transfers charge between said floating gate and said charge injector structure only when said data node has said first condition.

6. A memory system as set forth in claim 5 wherein said charge injector structure is an electron injector structure.

7. A memory system as set forth in claim 6 wherein said first capacitor has a capacitance substantially larger than the capacitance of said second capacitor.

8. A memory system as set forth in claim 7 wherein said electron injector structure is a dual electron injector structure having at least one layer of silicon-rich silicon dioxide.

9. A memory system as set forth in claim 8 wherein said dual electron injector structure has two layers of silicon-rich silicon dioxide separated by a layer of substantially impurity-free silicon dioxide.

10. A random access memory system comprising;
a semiconductor substrate,
a volatile memory cell having a data node formed in said substrate and first and second cross-coupled transistors, one of said transistors including:
a floating gate,
a first insulating layer disposed between said floating gate and said substrate,
a first control gate coupled to said data node,
a second insulating layer disposed between said floating gate and said first control gate,
a second control gate, and
a dual electron injector structure disposed between said floating gate and second control gate, and
means for applying control pulses to said second control gate for transferring data between said data node and said floating gate.

11. A random access memory cell comprising;
a volatile memory cell having first and second cross-coupled field effect transistors and first and second data nodes, each of said transistors includes:
a first capacitor,
a floating gate connected to said first capacitor and
a second capacitor coupled to said floating, said second capacitor including a dual charge injector structure,
means for connecting said first capacitor of said first transistor to said second data node,
means for connecting said first capacitor of said second transistor to said first data node, and
means coupled through said second capacitor to said floating gate of each of said transistors for transferring charge between said floating gate and said charge injector structures.

12. A random access memory cell as set forth in claim 11 wherein said volatile memory cell further includes first and second input/output transistors and first and second bit lines coupled to said first and second data nodes, respectively, through said first and second input/output transistors.

* * * * *